US012776786B2

(12) United States Patent
Frascati et al.

(10) Patent No.: US 12,776,786 B2
(45) Date of Patent: Oct. 27, 2026

(54) ENCODING AND DECODING SEQUENCES OF VALUES USING DELTA OFFSETS

(71) Applicant: Arm Limited, Cambridge (GB)

(72) Inventors: Christopher Paul Frascati, Liberty Hill, TX (US); Kèvin Petit, Great Wilbraham (GB)

(73) Assignee: Arm Limited, Cambridge (GB)

( * ) Notice: Subject to any disclaimer, the term of this patent is extended or adjusted under 35 U.S.C. 154(b) by 111 days.

(21) Appl. No.: 18/820,220

(22) Filed: Aug. 29, 2024

(65) Prior Publication Data

US 2026/0066924 A1 Mar. 5, 2026

(51) Int. Cl.
*H03M 7/00* (2006.01)
*H03M 7/30* (2006.01)
*H03M 7/42* (2006.01)

(52) U.S. Cl.
CPC ........... *H03M 7/42* (2013.01); *H03M 7/6005* (2013.01); *H03M 7/6011* (2013.01)

(58) Field of Classification Search
CPC .................................. H03M 7/42; H03M 7/46
USPC .......................... 341/50, 51, 52, 67, 65, 106
See application file for complete search history.

(56) References Cited

U.S. PATENT DOCUMENTS

| | | | | |
|---|---|---|---|---|
| 5,361,363 | A * | 11/1994 | Wells | G06F 15/17381 714/E11.011 |
| 2007/0220023 | A1* | 9/2007 | Dean | G06F 16/31 |
| 2008/0294863 | A1* | 11/2008 | Faerber | G06F 16/2228 711/170 |
| 2018/0121512 | A1* | 5/2018 | Cho | G06F 16/9024 |
| 2026/0019589 | A1* | 1/2026 | Chernyak | H04N 19/124 |

* cited by examiner

*Primary Examiner* — Peguy Jean Pierre
(74) *Attorney, Agent, or Firm* — Pearl Cohen LLP

(57) ABSTRACT

A method of encoding (e.g. compressing) data is disclosed. The data comprises a sequence of values. It is encoded by delta-encoding the sequence of values to generate a sequence of delta values, and encoding each delta value as an offset into a lookup table of delta values, thereby generating a sequence of offsets. The sequence of offsets, or data representative thereof, is stored or output as encoded data.

19 Claims, 5 Drawing Sheets

ENCODING AND DECODING SEQUENCES OF VALUES USING DELTA OFFSETS

TECHNICAL FIELD

The present disclosure relates to encoding (e.g. compressing) data comprising a sequence of values, e.g. for transmission over a communication link and/or for storage, and to corresponding decoding (e.g. decompressing) of the data.

BACKGROUND

Data is often generated as a sequence (e.g. a stream) of values. For example, a sensor such as an accelerometer may output sampled values at regular intervals. In many situations, the values change relatively slowly and steadily—i.e. with the derivative generally taking small values. It is known to compress such data using delta encoding, whereby each value is encoded as its difference from the preceding value in the sequence. For suitable data, this can significantly reduce the range of values needed to represent the data, and therefore allow for more efficient transmission or storage of the data.

However, there remains scope for improvements in encoding (e.g. compressing) sequential data.

BRIEF DESCRIPTION OF THE DRAWINGS

Certain embodiments of the invention will now be described, by way of example only, with reference to the accompanying drawings, in which.

DETAILED DESCRIPTION OF EMBODIMENTS

Figure 1:
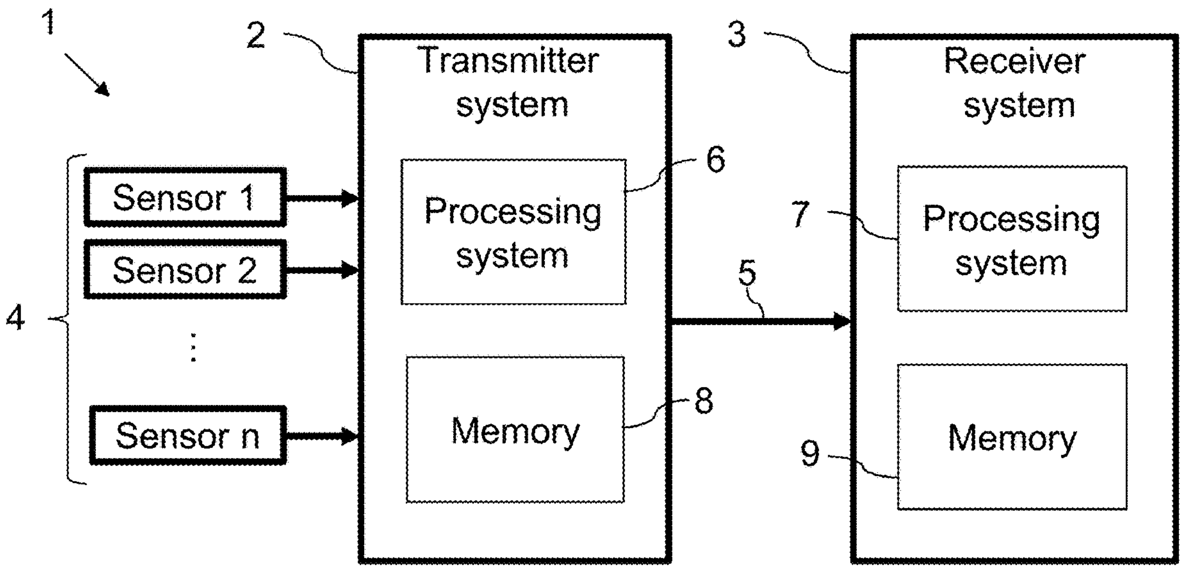
FIG. 1 is a schematic diagram of a data-processing system exemplifying the disclosure.

A first set of embodiments comprises a method of encoding (e.g. compressing) data comprising a sequence of values, the method comprising:

- delta-encoding the sequence of values to generate a (corresponding) sequence of delta values;
- encoding each delta value of the sequence of delta values as an offset into a lookup table of delta values, thereby generating a sequence of offsets; and
- storing or outputting the sequence of offsets, or data representative thereof, as encoded data.

A second set of embodiments comprises a method of decoding (e.g. decompressing) encoded data, the method comprising:

- decoding encoded data, wherein the encoded data comprises or represents a sequence of offsets into a lookup table of delta values, wherein decoding the encoded data comprises:
- using the lookup table to decode each offset of the sequence of offsets as a delta value contained in the lookup table at the respective offset, thereby generating a sequence of delta values;
- delta-decoding the sequence of delta values to generate a sequence of decoded values; and
- storing or outputting the sequence of decoded values as decoded data.

Each step of methods disclosed herein may be implemented by software executing on a processing system such as a CPU or GPU or DSP, or may be implemented by non-processor hardware such as application-specific digital logic circuitry (e.g. comprising integrated-circuit logic gates configured to perform the respective step). In some embodiments, all of the steps may be performed by software. In other embodiments, all of the steps may be performed by hardware (i.e. without using software), such as an integrated-circuit encoder or an integrated-circuit decoder. In other embodiments, a method disclosed herein may be performed using a combination of one or more steps implemented in software and one or more steps implemented in hardware.

Software as disclosed herein may be stored on a non-transitory computer-readable storage medium, such as a magnetic or solid-state memory (e.g. integrated within a microcontroller or system-on-chip). It may comprise instructions (e.g. of an application or program) for execution by a CPU, GPU or DSP.

Some embodiments provide a processing system comprising a processing unit (e.g. a GPU) and a memory storing instructions that, when executed by the processing unit, cause the processing unit to encode data comprising a sequence of values, wherein encoding the data comprises:

- delta-encoding the sequence of values to generate a sequence of delta values;
- encoding each delta value of the sequence of delta values as an offset into a lookup table of delta values, thereby generating a sequence of offsets; and
- storing or outputting the sequence of offsets, or data representative thereof, as encoded data.

Some embodiments provide a processing system comprising a processing unit (e.g. a GPU) and a memory storing instructions that, when executed by the processing unit, cause the processing unit to decode encoded data, wherein the encoded data comprises or represents a sequence of offsets into a lookup table of delta values, and wherein decoding the encoded data comprises:

- using the lookup table to decode each offset of the sequence of offsets as a delta value contained in the lookup table at the respective offset, thereby generating a sequence of delta values;
- delta-decoding the sequence of delta values to generate a sequence of decoded values; and
- storing or outputting the sequence of decoded values as decoded data.

The processing system may receive the data comprising the sequence of values from within or from outside the processing system (e.g. by reading the data from a memory internal or external to the processing system, or by receiving the data from a device external to the processing system such as a sensor). The memory may be integrated with the processing unit, e.g. on an integrated circuit, or may be non-integrated.

Some embodiments provide an integrated circuit comprising:

- an input for receiving input data comprising a sequence of values;

delta-encoding circuitry configured to process the sequence of values to generate a sequence of delta values;

offset-encoding circuitry configured to encode each delta value of the sequence of delta values as an offset into a lookup table of delta values, thereby generate a sequence of offsets; and an output configured for outputting the sequence of offsets, or data representative thereof, as encoded data.

Some embodiments an integrated circuit comprising:

an input configured for receiving encoded data, wherein the encoded data comprises or represents a sequence of offsets into a lookup table of delta values;

offset-decoding circuitry configured to use the lookup table to decode each offset of the sequence of offsets as a delta value contained in the lookup table at the respective offset, and thereby generate a sequence of delta values;

delta-decoding circuitry configured to process the sequence of delta values to generate a sequence of decoded values; and an output configured for outputting the sequence of decoded values as decoded data.

Encoded data and/or decoded data may be stored in a memory (e.g. random-access or non-volatile solid-state memory) and/or output over an internal communication link (e.g. within a processing system or integrated-circuit chip) or an external communication link (e.g. an external bus, such as an automotive communication bus).

The delta-encoding may comprise calculating, for each value of the sequence of values subsequent to an initial value, a difference between the value and an immediately preceding value of the sequence of values, or, for each value of the sequence of values, a difference between the value and a predetermined (e.g. constant) reference value.

The delta-decoding may comprise adding or subtracting each successive delta value of the sequence of delta values subsequent to an initial delta value, to or from a respective latest decoded value, or, adding or subtracting each successive delta value to or from a (or the) predetermined (e.g. constant) reference value.

Although certain types of data may be encoded without a reduction in size, in general the encoding method may be performed to compress data, and the decoding method may be performed to decompress data. In some embodiments, the encoded data—optionally plus the lookup table and any further lookup tables used to encode the data—is smaller (i.e. occupies fewer bits) than the input data. Compressing the input data can allow for more efficient communication of the data between the encoding system to a decoding system, e.g. allowing for faster transmission or for a lower channel capacity utilization.

The data for encoding (also referred to herein as input data) may, in some examples, be received from a sensor which may be a motion sensor. It may be a sensor of an automotive vehicle such as a self-driving car. The decoded data may be provided as input to a control system of a device such as a vehicle (e.g. an autonomous vehicle). It may be used to control one or more operations of the device.

In some embodiments, a fraction or all of the lookup table is already stored in a memory before the sequence of values is received as input data. In some embodiments, a fraction or all of the lookup table may be generated while processing the sequence of values. When generating the lookup table dynamically, the lookup table may be searched to determine if a delta value is already present in the lookup table, and the delta value may be to the lookup table if it is not already present. The searching may be performed for a plurality of the delta values in parallel using multiple processing threads (e.g. on a GPU) and a list of those delta values of the plurality that are not present in the lookup table may be stored. The delta values of the list may be added to the lookup table in parallel using multiple processing threads.

The lookup table may be a one-dimensional lookup table with the offsets being successive integer values. The lookup table, and any further lookup tables used in the encoding, may be output with the encoded data.

The sequence may be all or only a portion of the input data. The input data may comprise a first, longer sequence of values, of which the aforesaid sequence of values is a contiguous subsequence. The encoding may detect if the lookup table reaches a predetermined maximum size while processing a first portion (e.g. subsequence) of the input data and, if so, generate a new lookup table for encoding a second portion (e.g. subsequence) of the input data. This may occur multiple times over the course of encoding the input data.

More generally, the input data may comprise a first sequence of values that is partitioned into a plurality of contiguous subsequences (i.e. batches), and the encoding may further comprise generating a new lookup table for encoding each contiguous subsequence. The method may retain a fraction of the offsets of a first lookup table when generating a second lookup table, e.g. the most-recently-used offsets, or the most-frequently-used offsets, or each new lookup table may initially be empty. The encoding may comprise partitioning the input data into the plurality of contiguous subsequences of values, wherein the partitioning comprises determining when to end a first subsequence and start a second subsequence at least partly in dependence upon an analysis of the offset values generated from the first subsequence of values—e.g. when the members of a most frequently-used set offset values change by more than a threshold amount over the length of the first subsequence. The stored or output encoded data may, for each of the subsequences of the input data, comprise or represent a respective sequence of offsets into a respective lookup table. When performing the decoding, the decoded data may comprise a sequence that comprises a plurality of subsequence of decoded values corresponding to the plurality of subsequences of the input data.

The lookup table may always contain only a single occurrence of each delta, but in some embodiments the lookup table can contain at least one duplicated delta value (i.e. at two or more different respective offsets). In some example, the lookup table can contain no more than a maximum number of instances of any duplicated value, wherein the maximum number equals a number of processor cores used for compressing the sequence of values.

The encoding may further comprise compacting the sequence of offsets by encoding each offset as a predetermined number of bits before outputting the encoded data—i.e. using bit-packing. The predetermined number of bits may be determined (e.g. dynamically) in dependence upon a size of the lookup table. The size of the lookup table may vary, and the encoding method may further comprise using the size of the lookup table to calculate the predetermined number of bits before outputting the sequence of offsets.

The encoding may further comprise compacting the sequence of offsets by performing run-length encoding on the offsets before outputting the encoded data.

The lookup table may, in some embodiments, store only absolute delta values, and the encoding may comprise appending a binary flag to each offset to indicate a positive or a negative delta value.

The encoding and decoding may be lossless, or may be lossy only up to a loss of precision in the delta-encoding step (e.g. when subtracting values using floating-point arithmetic). Some embodiments further comprise receiving the sequence of values as floating point values; converting each value to an integer; and calculating each delta value using integer arithmetic. This can avoid any precision loss from doing arithmetic directly on the floating point values.

Intermediate results during the encoding and decoding, such as the sequence of delta values and/or the sequence of offsets, may be stored in an electronic memory, such as a random-access memory (RAM).

FIG. 1 shows an exemplary data-processing system 1 configured to encode data, and subsequently to decode the data, according to methods disclosed herein. It comprises a transmitter system 2 and a receiver system 3. The transmitter system 2 of this embodiment is arranged to receive data from a set of n sensors 4, and to compress the data for sending over a communication link 5. The receiver system 3 is configured to receive the compressed data and to decompress it for further processing.

The transmitter system 2 and receiver system 3 may each perform other functions in addition to their roles in communicating this sensor data.

In some embodiments, the transmitter system 2 is a bus sensor cluster of a self-driving vehicle, and the receiver system 3 is a processing cluster (e.g. a GPU-based artificial intelligence cluster) of the vehicle. The sensors 4 may be vehicle motion sensors, e.g. for measuring any one or more of: accelerator pedal position; brake pressure; steering angle; acceleration (e.g. x, y or z); angular velocity (e.g. x, y or z); vehicle speed; body pitch; body roll; or GPS-determined location (e.g. latitude or longitude). However, the compression and decompression methods disclosed herein are not limited to use in vehicles and may be used in many other contexts also, including for compressing data for storage and/or for communication.

Each system 2, 3 has a respective processing system 4, 5 and memory 6, 7. Each processing system 4, 5 may comprise one or more processing units (e.g. one or more GPUs) configured for executing software instructions (e.g. stored in the processing system 4, 5 or in the respective memory 6, 7) and/or may comprise non-processor hardware logic for performing one or more of the steps described herein. Each memory 6, 7 may comprise volatile random-access memory and/or non-volatile memory, and may be arranged for storing software and/or long-term data and/or working data.

The data for compression in this embodiment is a set of n streams of sensor data output from the sensors 4. Some sensors may output floating point values (e.g. 32 or 64 bits), while other may output signed or unsigned integer values (e.g. 32 or 64 bits). The transmitter system 2 may receive each sensor data stream as a respective sequence of values taken at regular or irregular sampling intervals. Each stream is compressed independently and transmitted over the link 5.

However, in other embodiments, the compression methods disclosed herein may be applied to any sequence of values—i.e. not only to sensor data. The compression algorithms are expected to be particularly effective when the values of the data for compression can be large, but where they typically change only slowly. In such situations, the number of bits needed to represent the derivative of the data may be significantly smaller than the bits of the input data.

Figure 2:
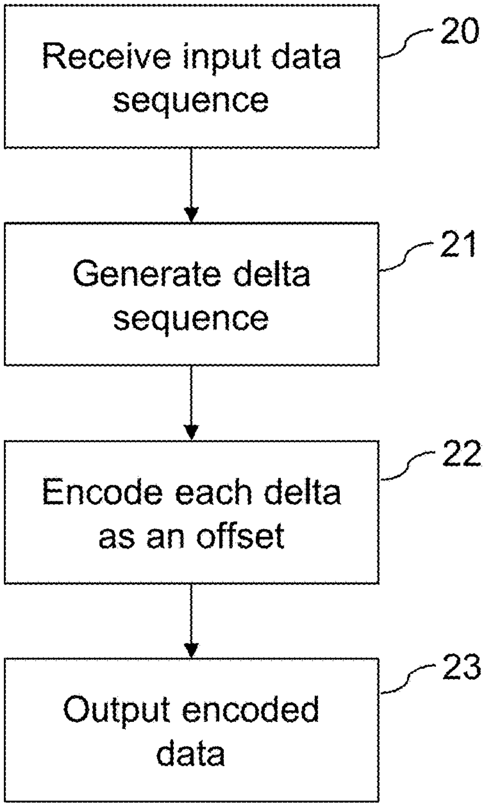
FIG. 2 is a flowchart showing a method of encoding data exemplifying the disclosure.

FIG. 2 outlines an encoding (i.e. compression) method performed by the transmitter system 2.

Input data is first received 20 by the processing system 6. This may be received from the memory 8, or from a sensor 4, or from a register or cache within the processing system 6. The input data is a sequence of values. Next 21, each value is subtracted from the preceding value in the sequence to determine a respective delta value, thereby generating a delta sequence. Each delta value is then encoded 22 as an offset into a one-dimensional lookup table. The lookup table may be specific to the input data (e.g. for specific to a particular sensor 4) and/or to a particular portion of the input data. This results in a sequence of offsets. This is then output 23 from the processing system 6 as encoded (i.e. compressed) data, with or without optional further processing (e.g. bit-packing and/or run-length encoding) being applied to the sequence of offsets before it is output. The lookup table may optionally also be included in the encoded data. The encoded data may be output to the memory 8 and/or over the communication link 5.

Figure 3:
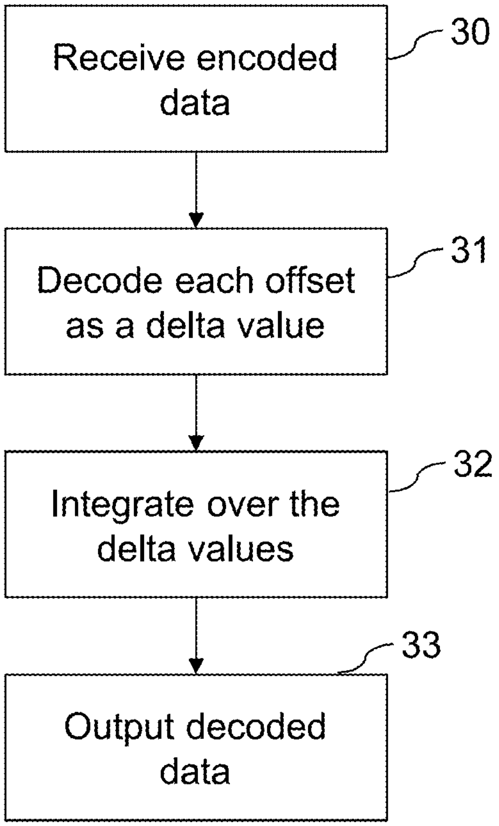
FIG. 3 is a flowchart showing a method of decoding data exemplifying the disclosure.

FIG. 3 outlines a corresponding decoding (i.e. decompression) method performed by the receiver system 3.

The encoded data is first received 30 by the processing system 7. This may be received directly from the link 5, or from the memory 9, or from a register or cache within the processing system 7. The encoded data may comprise a sequence of offsets into a lookup table of delta values, or may optionally be processed (e.g. run-length decoded and/or bit-unpacked) to extract such a sequence. It may also encode the lookup table. Next 31, each offset value is converted to a delta value by reading the corresponding value from the lookup table, thereby generating a sequence of delta values. The delta values are then successively accumulated (i.e. integrated) along the sequence in order to generate a corresponding sequence of decoded values. These may then be output to the memory 9 for storage, or to another part of the processing system 7 for further processing.

In some embodiments, the decoded data may be automotive motion-sensor data sensed from a self-driving vehicle, and may be output for processing by a processing cluster in order to operate the vehicle.

In some embodiments, the lookup table may be predetermined, e.g. being stored in the memory 8 and/or memory 9 during an initial manufacturing or calibration process. However, in other embodiments, the table is created dynamically by the transmitter system 2, which makes it available to the receiver system 3, e.g. by transmitting it as part of the encoded data over the link 5.

Figure 4:
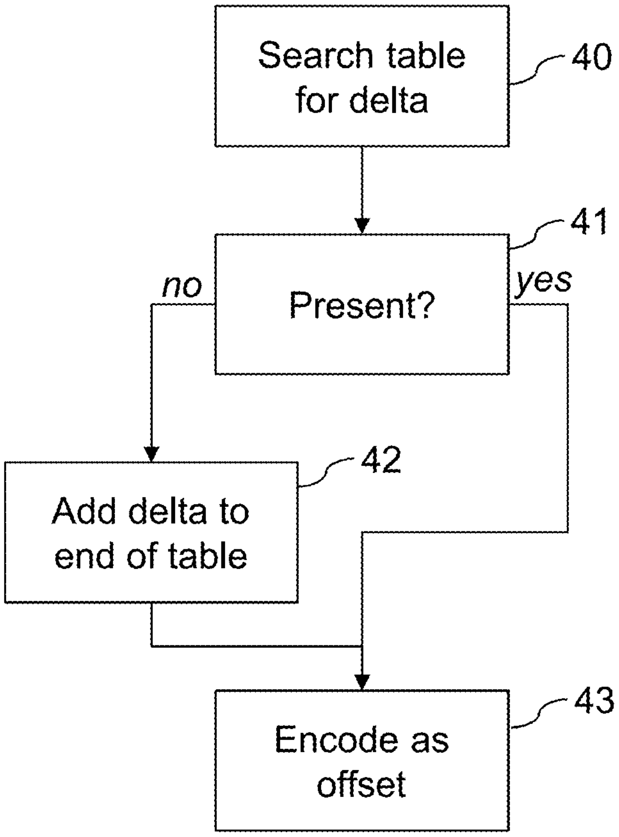
FIG. 4 is a flowchart showing more detail of one part of an encoding method exemplifying the disclosure.

FIG. 4 provides more detail of step 22 from FIG. 2 in embodiments where the lookup table is generated dynamically. A respective new lookup table may be generated for each of a contiguous or pairwise-overlapping plurality of contiguous subsequence of a longer input sequence of values. Each table may initially be blank, or may optionally be seeded with a subset of entries from a preceding table. It may have a predetermined fixed length. Each entry of the table may be of constant predetermined size—e.g. being a 32-bit signed or unsigned integer. Whenever a next delta value is to be encoded as an offset, the table is first searched 40 to see if it already contains that delta. If the check 41 for the presence of the delta is positive, then the delta is encoded 43 as the linear offset into the one-dimensional lookup table. If the check 41 fails, then the delta is written 41 to end of the table, and the delta is encoded 43 as the offset of the new entry.

In some embodiments, the lookup table stores only unsigned integers, and a binary flag is appended to each encoded offset value to indicate whether the corresponding delta value is positive or negative. For input data that has a similar distribution of positive deltas and negative deltas this can result in significant reduction in the size of the lookup table (e.g. up to 50% reduction).

In some embodiments, before outputting 23 the encoded data, the transmitter system 2 may further compress the sequence of offsets, e.g. using bit-packing and/or run-length encoding. It may perform bit-packing by identifying the bit-length of the largest offset into the lookup table (i.e. the position of the most-significant bit of the value) and packing all of the offsets to occupy that number of bits (optionally plus one bit for a positive/negative binary flag) to form a sequence of encoded data bits that spans native word boundaries (e.g. spanning 32-bit unsigned integer boundaries). The processing system 6 may be configured to selectively apply run-length encoding (RLE), e.g. depending upon a user configuration setting or upon the nature of the data being encoded. When RLE is applied to the offsets, it identifies a series of repeated offsets and replaces them with a set of RLE tokens. If the number of repeats is larger than a maximum number supported in the RLE token, e.g. based on the lookup table size, then multiple RLE tokens can be used.

The encoding methods disclosed herein may be implemented in a serialized manner on a single incoming data stream (e.g. using a CPU), but are also suitable for parallel processing (e.g. using a GPU) over a sequence of input values, e.g. by generating 21 the delta sequence in a parallelized manner, and then by encoding the deltas (including generating the lookup table) in a parallelized manner. However, care may be needed if multiple cores or threads are allowed to add delta values to respective cached copies of the same lookup table, to ensure consistency is maintained. This may be achieved using appropriate synchronization mechanisms such as barriers, e.g. as explained in more detail below.

In some embodiments, the lookup table may be allowed to contain duplicate entries of the same delta value (i.e. at two or more different respective offsets). This number of copies of any particular delta may be allowed to be up to the number of processor cores used for compressing the sequence of values—i.e. in some embodiments, each core may add a given delta no more than once.

The decoding methods disclosed herein may be implemented in a serialized manner on a single encoded data stream (e.g. using a CPU), but are also suitable for parallel processing (e.g. using a GPU).

For suitable input data, the encoding methods described herein can achieve large compression ratios. They may take advantage of the predictability of the data to allow for high compression with low computational overhead.

Where sensors have limited resolution, their precision may be much more limited than the data representation, leading to many repeated samples in the data. Sensor data has been found to be well-suited to methods disclosed herein.

However, more generally a benefit may be experienced wherever the range required to encode the delta of the incoming data is less than the range required to encode the actual data itself. The use of the lookup table (and optional bit-packing and RLE of the offsets) can then further compress the data, by allowing for a more compact representation of each delta. It may be especially beneficial where the same deltas appear often. For sensor data, the number of unique deltas is typically limited due to the resolution of the sensor.

Considering typical data output from: an automotive acceleration sensor; degrees latitude from a GPS position sensor; and degrees longitude from a GPS position sensor, the following compression ratios may, for example, be achievable:

| Signal | Data type | Number of unique delta values | Bits required to encode one element | Compression ratio for packed data |
|---|---|---|---|---|
| Acceleration_x (avg) | 64 bit float | 114.67 | 7 | 9.1x |
| Latitude_degree (avg) | 32 bit float | 52 | 6 | 5.3x |
| Longitude_degree (avg) | 32 bit float | 223.67 | 8 | 3.9x |

Further compression may be achieved through limiting the number of delta values by chunking the data, or using a least-recently-used scheme to reset the delta table.

When implementing the encoding on a parallel architecture, it can be insightful to understand the relative frequency of encountering new deltas for the particular type of data being encoded. If a delta already exists in the table, there is relatively little cost in converting a batch of deltas into the offsets into the delta table. When a delta is not in the table, the cost significantly rises, e.g. if the batch processing must be temporarily paused to add the new deltas to the table in order to guarantee delta-table coherency across work-items when using a GPU to process the data. In such contexts, the algorithm will perform particularly well, therefore, when most new deltas are discovered early in the dataset.

In some embodiments, the lookup table for a batch of data (i.e. a contiguous subsequence of a longer input sequence) may have a maximum size. When this maximum number of deltas is reached, some embodiments may reset the delta table and initiate a new batch with a new delta table. Other embodiments may take a more computationally expensive approach such as removing one or more least-recently used offsets from the table. Still further embodiments allow duplicate entries into the delta table (essentially aliasing multiple offsets to the same delta value). This removes the "slow" part of the algorithm at the expense of potentially expanding the table faster than necessary—essentially trading compression ratio for higher performance.

In some embodiments, the lookup table may contain no more than a maximum number of instances of any duplicated value, wherein the maximum number equals a number of processor cores used for compressing the sequence of values.

The input data for encoding may comprise a sequence of floating point values, or a sequence of signed or unsigned integer values. In some examples, the sequence of values may be received as floating point values; each value may be converted to an integer; and each delta value may be calculating using integer arithmetic. Although the resulting deltas may be very large, this will only affect the size of the lookup table, rather than the sequence of offsets, and so may not have too significant impact when the same table is used to encode a large batch of data. It can, however, beneficially avoid a potential loss of precision compared with calculating the deltas using floating point arithmetic.

Due to the limitations of IEEE 754 floating-point arithmetic, it is possible to accumulate error, especially when subtracting floating point values. The distribution of possible representable values is most dense between −1 and +1, and drops by a half for every subsequent power of 2 (i.e. [−2, −1], [1,2] has half the values of [−1, 1]; then [−4, −2], [2, 4] has a quarter the values of [−1, 1], etc.) The subtraction problem is most apparent when subtracting a large number from a value very close to itself.

For 32-bit floating point, precision is only reasonably accurate to the 10-7 digit. When using floating-point delta calculation, some embodiments are therefore technically lossy, albeit with a typical error less significant than that of floating point precision. However, this can be avoided in embodiments in which the delta encoding operates on received IEEE 754 values as unsigned integers. Such embodiments may need to size the delta table suitably to avoid potential overflow. This avoids the precision issues with floating point arithmetic and need not materially affect the overall compression ratio.

In some embodiments, the encoded data is associated with two headers. The first header (a file header) defines global settings for the compressed data. Some of these settings are not needed for decompression, however it provides enough metadata to allow for debugging and experimentation even if nothing other than the compressed buffer is provided. Additionally, for a streaming use case, this can be reused as an input token to control the compression algorithm (compared with an offline tool embodiment which would just take in command-line parameters). The second header (a batch header) contains information to decode that batch of data.

Here follows some exemplary pseudocode for decoding encoded data according to some embodiments, in which a binary flag has been used for discriminating positive and negative delta values, and in which RLE has been performed:

```
// Pull parameters from header (number of entries, size in bits of each
entry, etc.)
// Get initial value based on parameters
// output[0] = initialValue
// loop through data "numBits" at a time
   // offset = ValueAtBitOffsetIntoArray(data, i * numBits)
   // repeats = 1
   // If offset == RLE escape token
      // offset = offset from RLE token
      // repeats = repeats from RLE token
   // MSB of the offset denotes positive (0) or negative (1)
   // if MSB = 0
      // currentValue = previousValue + deltaTable[offset]
   // else
      // currentValue = previousValue − deltaTable[offset]
   // while repeats > 0
      // output[i] = currentValue
      // repeats−−
```

The header formats may support the above decoding algorithm, and corresponding encoding algorithms, while being flexible enough to support different customizations.

The file header may include any one or more, or all, of:

a "fast mode" enabled flag;

an RLE enabled flag;

the number of bits for the delta table (numBits);

the number of batches;

the element size;

an RLE minimum threshold;

a floating point flag;

a version number;

an offset to the first batch.

When set, the fast-mode flag may signal to indicate that the encoding algorithm performs single pass compression with a fixed table size. Number of bits for the delta table must be >0. If not set, the encoding algorithm dynamically determines the table size on a first pass through the data, then packs the offsets accordingly on a second pass.

The number of bits for the table value is only used if fast mode is enabled. The number of values that can be in the delta table is (2numBits-1−2). The most significant bit (MSB) is reserved to indicate whether the value in the delta table is to be treated as negative. The additional reserved slot is because the offset of 2numBits-1 ("negative" 0) is reserved as the RLE token.

The number of batches in the file corresponds to the number of contiguous subsequences of the input data that each have a respective lookup table. Zero is a special case indicating that this is a "streaming" application where there is no limit to the number of batches that may follow.

The element size may indicate 32 bit or 64 bit.

The RLE minimum threshold defines how many times an element must be repeated before substituting the chain with an RLE token. The default in some embodiments is eight. Zero is a special mode where the algorithm implementation makes the decision based on runtime analysis of the data.

If the floating point flag is set, treat the input as floating-point data and do the delta calculations (encoding and decoding) using floating-point arithmetic. If not set, treat the input as integer data and do the delta calculations using integer arithmetic.

The batch header may include any one or more, or all, of:

a reset delta value flag & associated value;

a frame of reference encoding flag & associated value;

the number of entries in the delta table;

the number of packed elements in the batch;

the delta table.

If the reset delta value flag is set, it indicates this batch will use the associated value as the initial reference value for this batch. If not set, this batch will use the last calculated value from the previous batch. If this is the first batch, zero will be used as the reference value.

If the frame of reference encoding flag is set, all delta calculations will use the associated value as the left-side of the delta calculation (i.e. will subtract from this reference value). If not set, all delta calculations after the initial calculation will use the previous value in the sequence as the left-side of the delta calculation.

If fast mode is enabled, the value for the number of entries in the delta table should be able to fit within the number of bits specified by numBits in the file header; that is, it must be less than or equal to 2numBits-1−2.

The number of packed elements is used when bit-packing is performed. If the last element does not end on a 32-bit boundary, any subsequent batch headers will be aligned to the next 32-bit boundary.

The delta table entry comprises one element-sized word per delta. The delta table only stores the absolute value. In order to get a negative value in the table, the MSB of the offset is treated as negative when set to one.

Immediately following the batch header in the encoded data are the bit-packed offsets into the delta table.

RLE, when used in the encoding, is performed after the conversion of value to offsets, and is embedded into the packed offset data as a special series of tokens, and therefore uses the same sizes as all of the other data. RLE is triggered by using the "negative 0" offset into the delta table as a special escape token. It identifies the series of repeated offsets and replaces this with the set of RLE tokens. If the number of repeats is larger than the maximum number supported in the RLE token based on table size, it uses multiple RLE tokens.

If the number of unique deltas is larger than can be supported by the table size, multiple batch headers can be used. Each batch must include the full delta table needed for the batch.

This is an example format for the encoded data, and corresponding encoding/decoding steps, but it will be appreciated that other formats and steps may be performed in other embodiments.

Some optimizations that may be supported in some embodiments will now be described.

Streaming data: If the goal is to compress data on-the-fly, the file header can be used as the control packet, or parameters can be passed in to initialize a socket(-like) construct. The implementation will have a buffer to receive the raw data from the "socket," then will do the compression in chunks pulled from the buffer. Control planes can be defined to allow the producer to control when to close & start a new batch, as well as notifying/sending compressed data back to the consumer. The compression algorithm will still split batches as required above.

Fixed table size ("fast mode"): The size of the delta table is fixed at the initialization of the algorithm. This could be because the number of possible deltas is known based on a priori knowledge of the data, or throughput is more critical than "perfect" compression.

Pre-populated delta table: The file header can be extended to allow for seeding a delta table to be used by the batches. This may be a complete table if all possible values are known (and used in conjunction with fast mode), or may be a seed of the most common values in order to speed up the processing time by needing by requiring fewer deltas to be added to the table in real-time.

Intelligent delta table management: Instead of resetting the full table on every new batch, tracking may be done to do a partial elimination of deltas based on things like least recently used, least frequently used, etc.

Intelligent batch splitting: Similar to intelligent delta table management, the offsets can be tracked and if the repeated values have shifted significantly from when the batch began, closing the batch may allow for a smaller delta table, and therefore a more compressed batch and/or better overall compression (i.e. if the first half of data only used 120 deltas, and the second half used a completely unique 120 deltas, intelligent splitting could keep both batches at 8 bits per entry (2(8-1)−2=126 max deltas) rather than needing 9 bits per entry (2(9-1)−2=254 max deltas).

Lazy delta table search/aliased delta values: The decompression algorithm does not care if multiple offsets have the same delta value. It may be possible to improve performance by not doing a deep search of the table, and instead only searching for the most common values, then adding (and potentially duplicating) values outside of that subset.

Figure 5A:
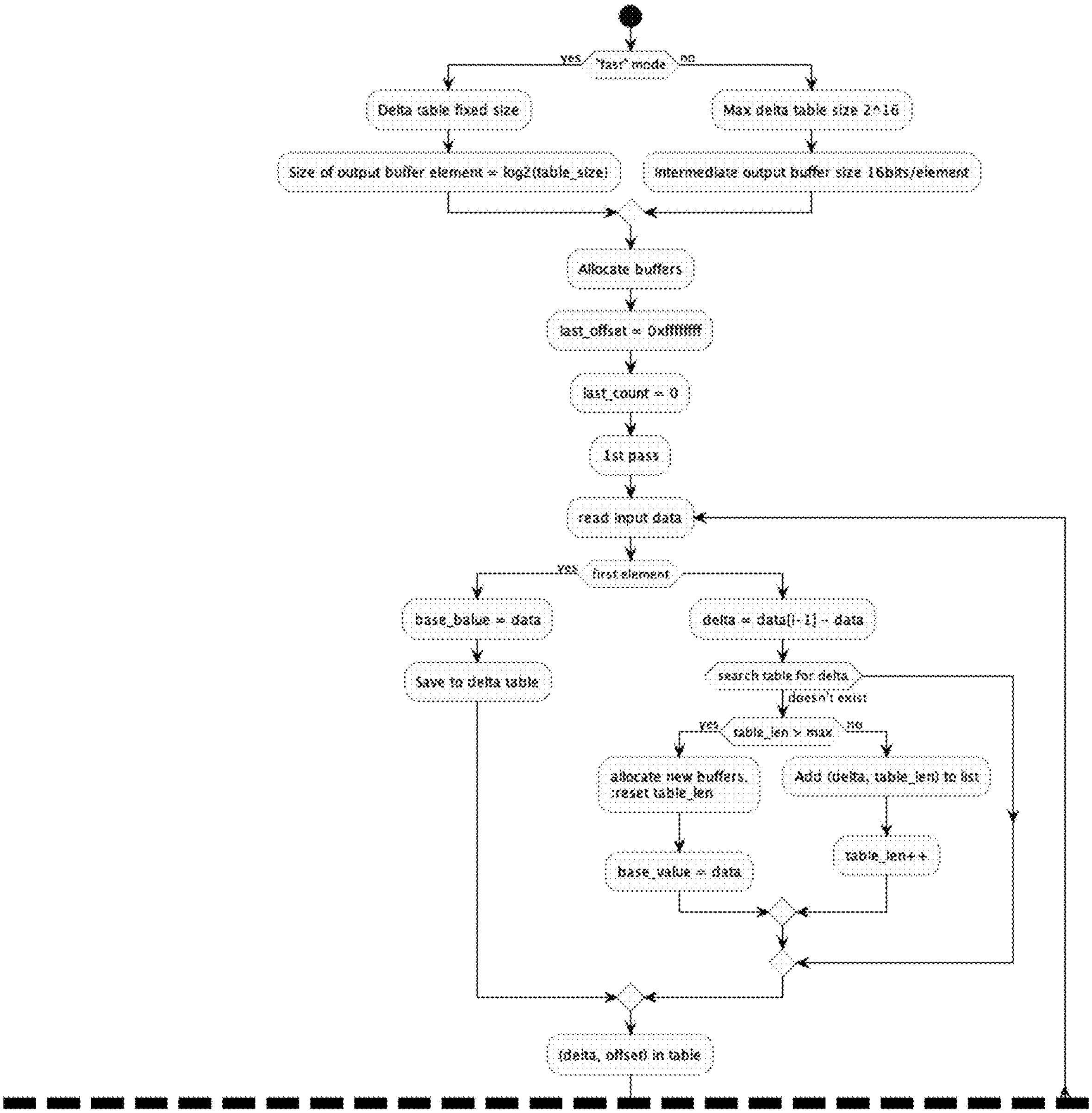
FIGS. 5*a* & 5*b* are a flowchart showing a method of encoding data exemplifying the disclosure.
Figure 5B:
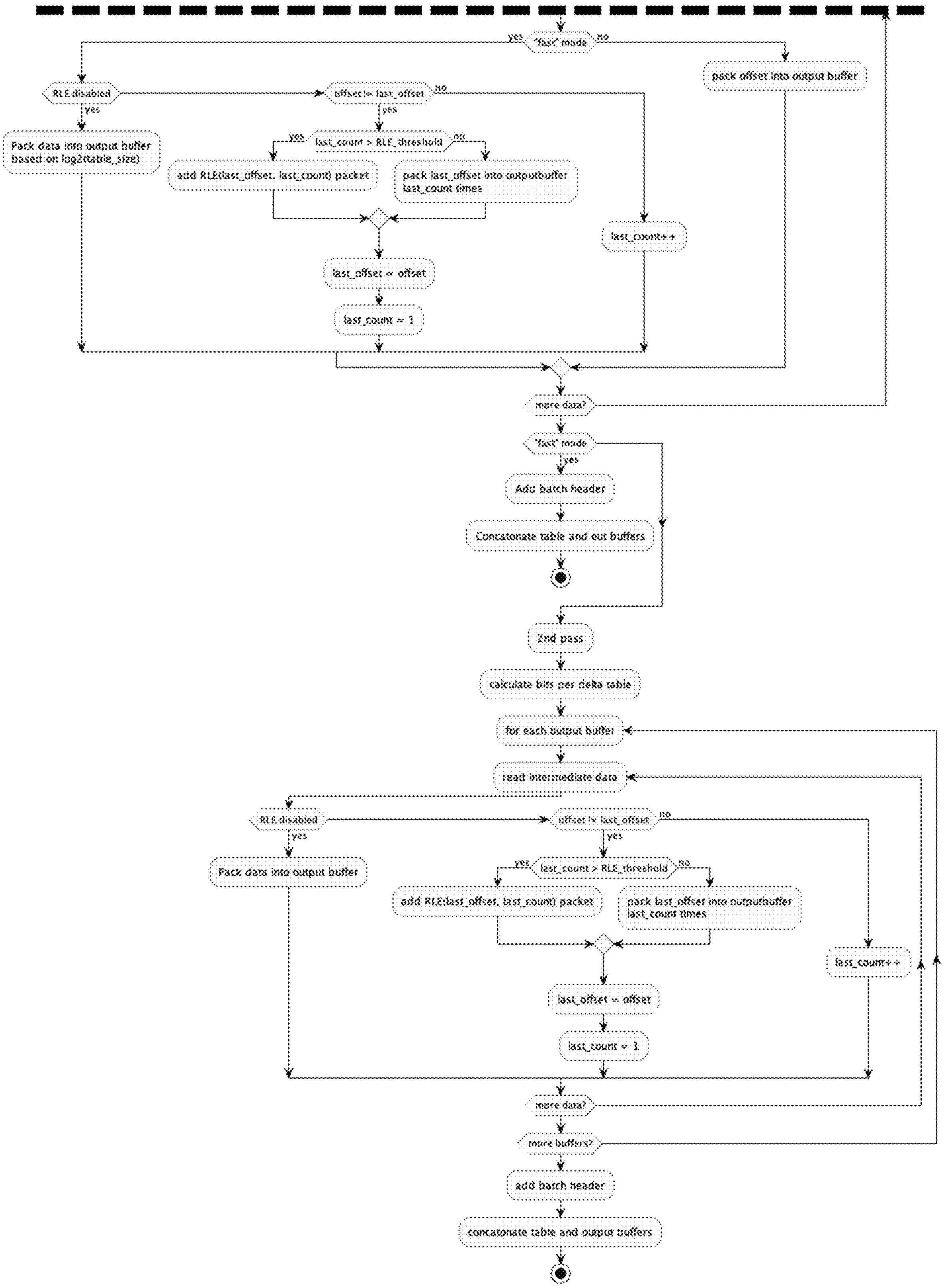

FIGS. 5*a* and 5*b* provide a detailed example of steps that may be performed in an encoding (i.e. compression) method according to the disclosure. The two figures represent a single flowchart when joined at the dashed lines.

In this example, there are two modes of operation-one where the deltas are known (perhaps because the characteristics of the sensor limit the possible deltas), and one that requires an extra pass and calculates the delta table on the second pass. When writing offsets into the output buffer, they will be packed according to the minimum number of bits required to encode any of the valid offsets into the table. This example algorithm is not attempting to use a variable bit size based on frequency. Additionally, as data is prepared to be written to the output buffer, the algorithm is tracking for repeated data. If data is repeated more than a certain threshold (default is three repeats), a RLE token will be added to indicate how many times the data is to be repeated on decompression.

The algorithm accounts for the default options specified in the file header:

"fast" or "max" mode, where fast mode caps the delta table at the specified length (good for cases where this information is fixed for the given data, or where speed is more critical), and where max mode sets the delta table to the smallest size and requires a second pass to bit-pack the offsets (good for cases where the delta table size isn't fixed)

RLE enable (with threshold), which enables RLE logic and optionally overrides the threshold where a RLE token will be added Data type: float vs. integer vs. unsigned integer Data size: 32 bit or 64 bit The algorithm could be implemented in a linear single threaded application, but performance may be improved by implementing it on a GPU to use parallelization to enable fast searching of the delta table, and fast insertion of data into the delta table.

Figure 6:
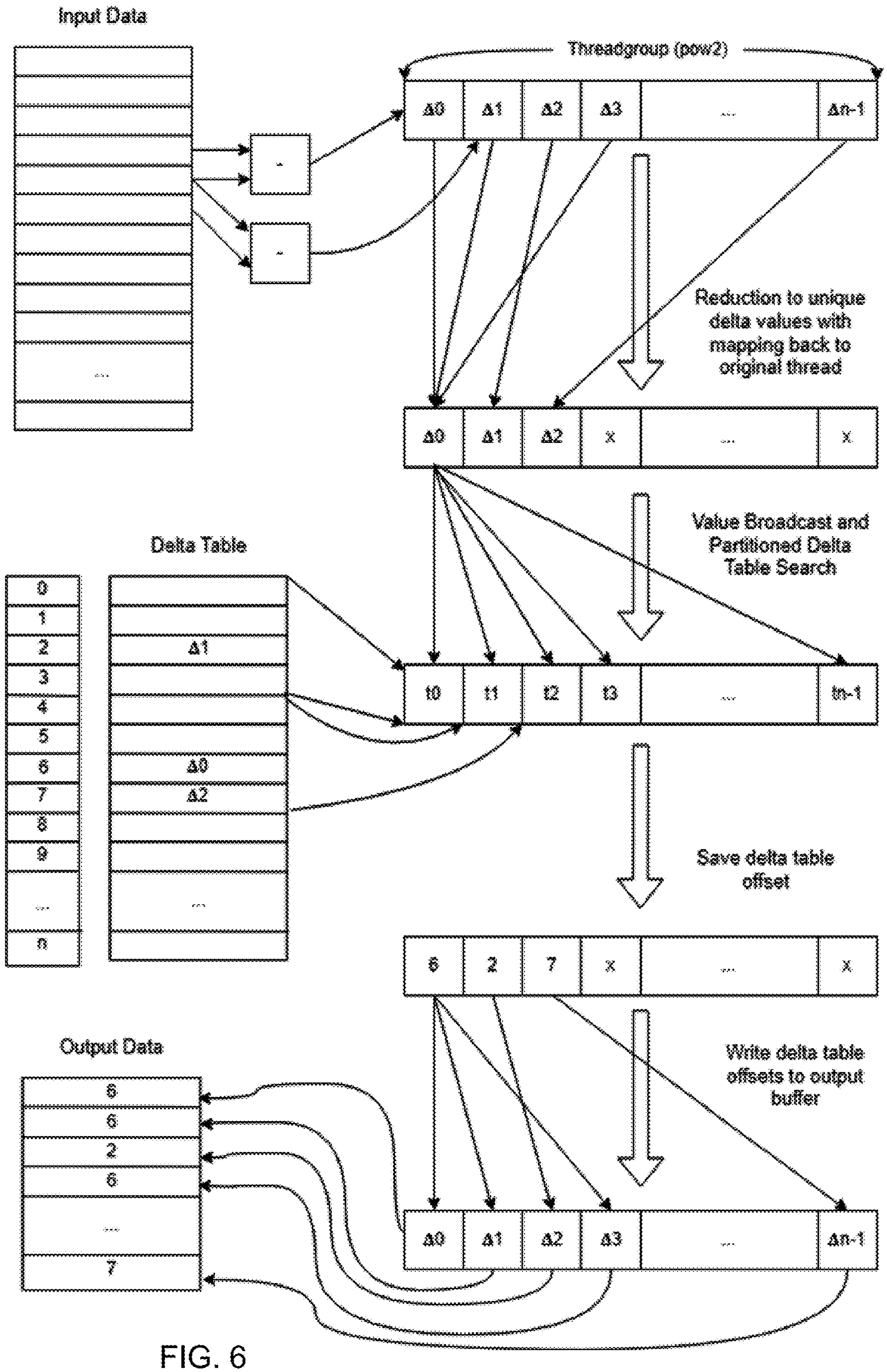
FIG. 6 is a schematic diagram illustrating a software implementation of a method of encoding data exemplifying the disclosure.

FIG. 6 shows an example flow of data through an exemplary GPU-based software implementation of an encoding method. Delta encoding is applied pairwise to the sequence of input data (illustrated by the minus signs near the top left of the diagram), with the results being stored as a sequence of deltas, labeled "threadgroup" in the top right. Then, a reduction to unique delta values is performed, with mapping back to the original thread, to generate a list of unique delta values. These values are broadcast and a partitioned delta table search is performed to identify the corresponding offset for each delta value. Then, the appropriate delta-table offsets are written to an output buffer in order to encode the sequence of deltas, thus forming encoded output data.

Pseudocode of an example GPU-based implementation is as follows:

Process data in batches of workgroup size
For each iteration of the data loop (in chunks of workgroup size)

- Cache num_workgroup delta elements in local memory
  - o delta[i] = data[i−1] − data[i]
- Each workitem loops through cached elements
  - o Each workitem assigned a slot in the table (i.e. delta_table[id % workgroup_size])
  - o If delta[i] matches,
    - ■ Write the offset to output_buffer[i] (offset = (id % workgroup_size))
    - ■ Mark delta[i] as added
      - Set bit on appropriate array in local memory (is_processed)
    - ■ Else
      - Do nothing
    - ■ Add a barrier
    - ■ At this point, the "is_processed" variable contains flags -continued

```
        corresponding to deltas which weren't found in the table
    ■   Reduce "is_processed" to a list of deltas which remain
        •   // This is expected to be 100% processed in the steady-state
    ■   if(is_processed[id % workgroup_size] == false)
        •   new_deltas[atomic_incr] = delta[(loop_offset) + (id %
            workgroup_size)]
        •   // also save off data offset so we can write the delta_offset to
            the output_buffer
    ■   barrier
    ■   if (num_new_deltas > 0)
        •   loop over new_deltas
            o   if(delta_table[id] == new_deltas[i]) // not needed for
                the first entry
                ■   atomic_set(exists)
            o   barrier
            o   if((id == 0) && (exists == false))
                ■   delta_table[size++] = delta
                ■   new_delta[i] = offset (size in previous line
                    before incrementing)
            o   barrier
            o   loop over new_deltas
            o   output_buffer[new_delta_offset_from_above] =
                new_deltas[i]
```

Further pseudocode of an example GPU-based implementation, intended for implementation on an Arm™ Mali™ GPU, follows:

```
// Processed in threadgroups of 16 (for Mali ™...other GPUs may use different
threadgroup sizes)
void kernel fast_convert_to_offsets_f32(...)
{
  // Calculate the delta for the data corresponding to the thread
  unsigned int globalOffset = get_group_id(0) * get_sub_group_size( );
  unsigned int localOffset = globalOffset + get_local_id(0)
  unsigned int delta = inData[localOffset] − inData[localOffset − 1];
  unsigned int firstInstanceId = get_local_id(0);
  // Using subgroups, create mapping to 1st instance of delta value
  // loop over all other threads in subgroup
  {
    if (delta == deltaFromOtherThread)
    {
      // update firstInstanceId to be the lower threadId of the threads with the same
delta
    }
  }
  // use ballot to identify the 1st instances of the delta values
  const bool firstInstanceOfData = (firstInstanceId == get_local_id(0))
  unsigned int firstinstanceBallot = sub_group_ballot(firstInstanceOfData);
  ...
      // use parallel prefix sum to compact the list of unique deltas
  unsigned int localSlot = parallel_prefix_sum(firstinstanceBallot);
  // Broadcast the localSlot value to all threads that have the same firstInstanceId
      ...
  // There can be up to 16 unique deltas per threadgroup (though 1 - 2 is far more
common)
      // Use local memory to hold compacted list of deltas and offsets into the delta
table
  local unsigned int processDelta[get_sub_group_size( )];
  local unsigned int deltaOffset[get_sub_group_size( )];
  if (firstInstanceId == get_local_id(0))
  {
    processDelta[localSlot] = delta;
    offsetValue[localSlot] = −1;
  }
  // delta == 0 is always at slot 0 in the deltaTable, and is by far the most common delta
value.
  // Optimize appropriately to avoid searching for it
  // Synchronize threads to allow for distributed table search
      ...
  // Divide the table into chunks and distribute search for each delta across threads
  for (unsigned int i = 0; i < numChunksInDelta Table; i++)
  {
    // account for end of table not a multiple of numChunksInTable
    ...
    for (unsigned int j = 0; j < numUniqueDeltas; j++)
```

-continued

```
    {
      int deltaTableOffset = get_thread_delta_table_offset( );
      if (deltaTable[deltaTableOffset] == processDelta[j])
      {
        offsetValue[j] = deltaTableOffset;
      }
      // Optimize the table search to abort it across all threads if/when all deltas found
    }
  }
  // add new values to the end of the table
  if(get_local_id(0) == 0)
  {
    for (unsigned int j = 0; j < numUniqueDeltas; j++)
    {
      if (offsetValue[j] == -1)
      {
        add_delta_to_table( );
      }
    }
  }
  // write delta table offset to output buffer
  outputBuffer[localOffset] = offsetValue[broadcastedLocalSlot];
}
```

It will be appreciated that the present disclosure presents various specific embodiments, but is not limited to these embodiments; many variations and modifications are possible, within the spirit and scope of the disclosure.

We claim:

1. A method of encoding data comprising a sequence of values, the method comprising:

delta-encoding the sequence of values to generate a sequence of delta values;

encoding each delta value of the sequence of delta values as an offset into a lookup table of delta values, thereby generating a sequence of offsets; and storing or outputting the sequence of offsets, or data representative thereof, as encoded data; further comprising:

generating a fraction, or all, of the lookup table of delta values after generating the sequence of delta values, wherein generating the fraction, or all, of the lookup table comprises searching the lookup table to determine if a delta value is already present in the lookup table, and adding the delta value to the lookup table when the delta value is not already present in the lookup table.

2. The method of claim 1, wherein delta-encoding the sequence of values comprises calculating, for each value of the sequence of values subsequent to an initial value, a difference between the value and an immediately preceding value of the sequence of values.

3. The method of claim 1, further comprising:

searching for a plurality of the delta values in parallel using multiple processing threads;

storing a list of delta values of the plurality that are not present in the lookup table; and adding the delta values from the list to the lookup table in parallel using multiple processing threads.

4. The method of claim 1, further comprising outputting the lookup table and the encoded data over a communication link.

5. The method of claim 1, further comprising detecting when the lookup table reaches a predetermined maximum size while processing a first portion of the sequence of values, and, in response, generating a new lookup table for encoding a second portion of the sequence of values.

6. The method of claim 1, wherein the data for encoding comprises a first sequence of values of which the sequence of values is a contiguous subsequence, and the method further comprises generating a respective new lookup table for encoding each of one or more further contiguous subsequences of the first sequence of values.

7. The method of claim 6, further comprising retaining a fraction of the offsets of a preceding lookup table when generating a new lookup table.

8. The method of claim 6, further comprising partitioning the first sequence of values into the plurality of contiguous subsequences, wherein the partitioning comprises determining when to end a first subsequence and start a second subsequence at least partly in dependence upon an analysis of the offsets encoding the first subsequence.

9. The method of claim 1, wherein the lookup table contains at least one duplicated delta value.

10. The method of claim 1, further comprising compacting the sequence of offsets using bit-packing before storing or outputting the encoded data.

11. The method of claim 1, further comprising compacting the sequence of offsets using run-length encoding before storing or outputting the encoded data.

12. The method of claim 1, wherein the lookup table comprises absolute delta values, and wherein encoding each delta value further comprises appending a binary flag to each offset to indicate whether a delta value is positive or negative.

13. The method of claim 1, wherein the sequence of values is a sequence of floating point values, and wherein delta-encoding the sequence of values comprises:

converting each floating point value to an integer, thereby generating a sequence of integers; and using integer arithmetic to generate the sequence of delta values from sequence of integers.

14. The method of claim 1, wherein encoding the data compresses the data, such that the encoded data is smaller than the data comprising the sequence of values.

15. The method of claim 1, wherein the data comprising the sequence of value is data obtained from a motion sensor.

16. A non-transitory computer-readable medium storing instructions that, when executed on a processing unit, cause the processing unit to perform the method of claim 1.

17. The method of claim 1, wherein delta-encoding the sequence of values comprises calculating, for each value of the sequence of values, a difference between the value and a predetermined reference value.

18. A method of encoding data comprising a sequence of values, the method comprising:

delta-encoding the sequence of values to generate a sequence of delta values;

encoding each delta value of the sequence of delta values as an offset into a lookup table of delta values, thereby generating a sequence of offsets; and storing or outputting the sequence of offsets, or data representative thereof, as encoded data;

wherein a fraction, or all, of the lookup table of delta values is already stored in a memory before commencing the delta-encoding.

19. A non-transitory computer-readable medium storing instructions that, when executed on a processing unit, cause the processing unit to perform the method of claim 18.

* * * * *